(12) United States Patent
Cavallaro et al.

(10) Patent No.: US 11,899,506 B2
(45) Date of Patent: Feb. 13, 2024

(54) ELECTRONIC DEVICE HAVING THERMAL SPREADING THROUGH A HINGE OF A CONFIGURABLE HOUSING THAT SUPPORTS A FRONT FLEXIBLE DISPLAY

(71) Applicant: MOTOROLA MOBILITY LLC, Wilmington, DE (US)

(72) Inventors: Alberto R. Cavallaro, Northbrook, IL (US); Wayne G. Morrison, Lake Zurich, IL (US)

(73) Assignee: Motorola Mobility LLC, Chicago, IL (US)

( * ) Notice: Subject to any disclaimer, the term of this patent is extended or adjusted under 35 U.S.C. 154(b) by 2 days.

(21) Appl. No.: 17/218,651

(22) Filed: Mar. 31, 2021

(65) Prior Publication Data

US 2022/0317741 A1    Oct. 6, 2022

(51) Int. Cl.
*G06F 1/16* (2006.01)
*G09F 9/30* (2006.01)
*H05K 7/20* (2006.01)
*G06F 1/20* (2006.01)

(52) U.S. Cl.
CPC .......... *G06F 1/1681* (2013.01); *G06F 1/1652* (2013.01); *G06F 1/203* (2013.01); *G09F 9/301* (2013.01); *H05K 7/20954* (2013.01)

(58) Field of Classification Search
CPC ...... G06F 1/1681; G06F 1/1652; G06F 1/203; G09F 9/301; H05K 7/20954
See application file for complete search history.

(56) References Cited

U.S. PATENT DOCUMENTS

| | | | |
|---|---|---|---|
| 10,063,677 B2 | 8/2018 | Cavallaro et al. | |
| 10,331,247 B2 | 6/2019 | Jinbo et al. | |
| 10,403,189 B2 | 9/2019 | Aurongzeb et al. | |
| 10,409,335 B2 | 9/2019 | Wood et al. | |
| 10,469,635 B1* | 11/2019 | Carlson | H04M 1/0216 |
| 10,656,684 B2 | 5/2020 | Wood et al. | |
| 10,834,814 B2 | 11/2020 | Cho et al. | |
| 11,178,779 B2* | 11/2021 | Sim | G06F 1/1681 |

(Continued)

FOREIGN PATENT DOCUMENTS

CN    111147630    5/2020

OTHER PUBLICATIONS

UKIPO Search Report, GB2204001.8, dated Aug. 17, 2022.

*Primary Examiner* — Abhishek M Rathod
(74) *Attorney, Agent, or Firm* — Isidore PLLC

(57) ABSTRACT

An electronic device, a communication device, and a method enhance thermal energy spreading via thermal spreader layer(s) of a flexible layer assembly extending through a hinge coupling first and second device housings of a configurable housing assembly. The thermal spreader layer is positioned on a surface of a flexible circuit of the flexible layer assembly. The thermal spreader layer has one end thermally coupled to a first structure within the first device housing and another end thermally coupled to a second structure within the second device housing to transfer thermal energy between the first and the second structures. The flexible layer assembly deforms within one or both of a first and second chamber respectively of the first and second device housings when the first and second device housings pivot about the hinge from a closed position to an axially displaced open position.

16 Claims, 14 Drawing Sheets

(56) References Cited

U.S. PATENT DOCUMENTS

| | | | |
|---|---|---|---|
| 11,294,429 B2 | 4/2022 | Oh et al. | |
| 11,360,590 B2 | 6/2022 | Jinbo et al. | |
| 11,416,040 B1 | 8/2022 | Cavallaro et al. | |
| 2012/0235172 A1* | 9/2012 | Roberts | F21K 9/23 |
| | | | 257/E33.075 |
| 2017/0272559 A1 | 9/2017 | Cavallaro et al. | |
| 2017/0295642 A1* | 10/2017 | Codd | H05K 1/0216 |
| 2018/0164854 A1 | 6/2018 | Wood et al. | |
| 2018/0347921 A1* | 12/2018 | Morrison | H01L 23/3733 |
| 2019/0220067 A1* | 7/2019 | Sugiura | H04R 1/025 |
| 2019/0317572 A1* | 10/2019 | North | G06F 1/203 |
| 2019/0361504 A1 | 11/2019 | Wood et al. | |
| 2020/0356143 A1* | 11/2020 | Oh | G06F 1/203 |
| 2021/0109576 A1* | 4/2021 | Kurma | G06F 1/203 |
| 2021/0132662 A1* | 5/2021 | Cavallaro | G06F 1/1643 |
| 2021/0185852 A1* | 6/2021 | Yang | G06F 1/203 |
| 2021/0232182 A1* | 7/2021 | Peng | G06F 1/1681 |
| 2021/0373628 A1 | 12/2021 | Lin et al. | |
| 2022/0232729 A1 | 7/2022 | Ohyama et al. | |

\* cited by examiner

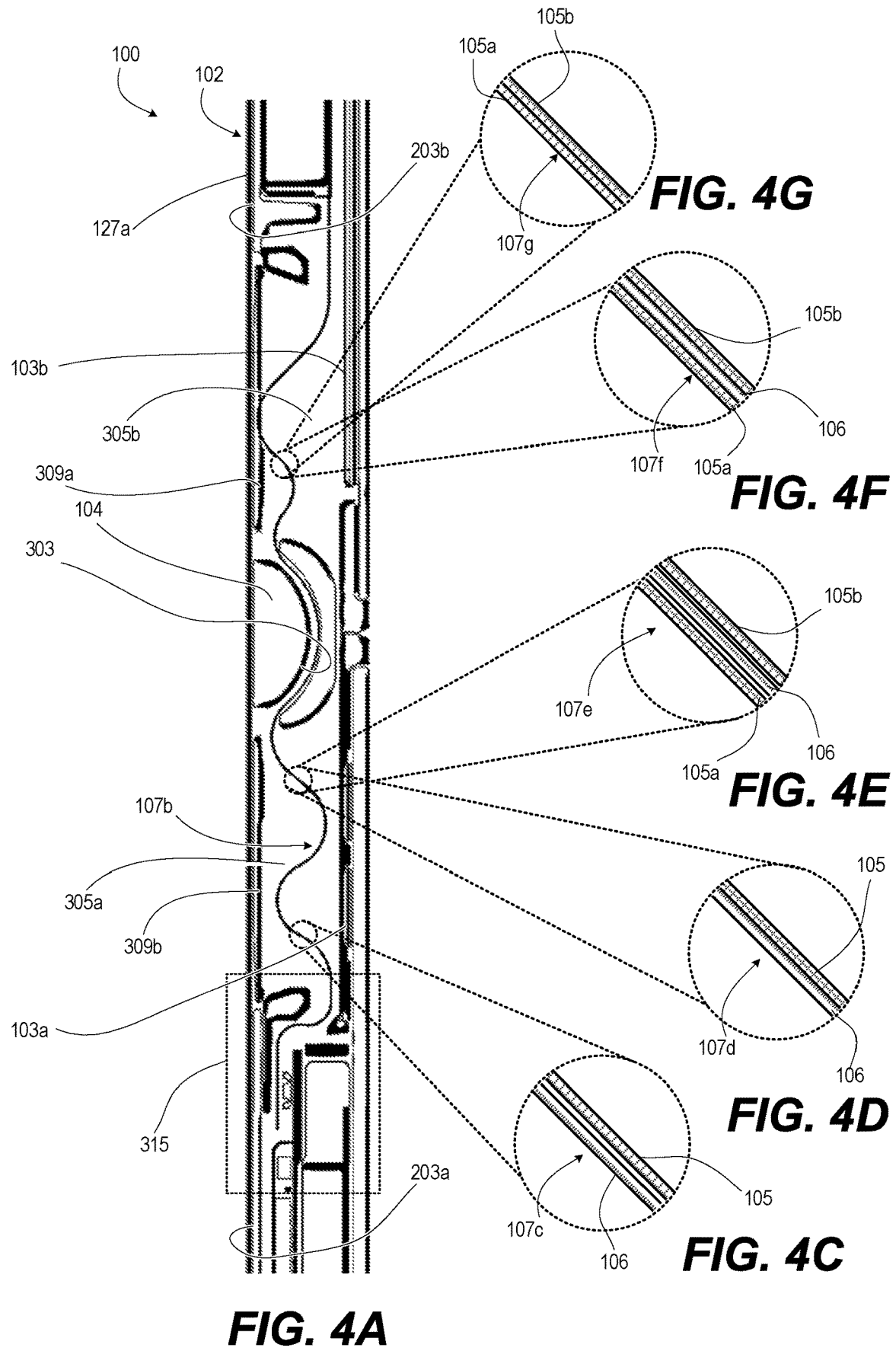

ELECTRONIC DEVICE HAVING THERMAL SPREADING THROUGH A HINGE OF A CONFIGURABLE HOUSING THAT SUPPORTS A FRONT FLEXIBLE DISPLAY

BACKGROUND

1. Technical Field

The present disclosure relates generally to communication devices having a configurable housing, and more particularly to communication devices having a configurable housing that supports thermal dissipation.

2. Description of the Related Art

Electronic devices such as smart phones and tablet computers have functional computing and communication components that generate thermal energy. In one example, surface mount integrated circuit modules such as microprocessors and graphics drivers have highly dense circuitry operated at high clock speeds and thus dissipate a lot of heat while operating. In order to prevent overheating and damage of these modules, heat spreaders and heat sinks are utilized to dissipate heat away from the module. To facilitate mobility, many of these electronic devices have lightweight configurable housing assemblies with two separate housings that fold around a hinge mechanism to fit into a pocket or a handbag. The hinge mechanisms of the configurable housing assemblies generally do not conduct thermal energy and thus prevent heat transfer and/or limits thermal spreading between the two housing portions of the configurable housing assembly. This limiting of thermal spreading across the configurable housing assembly causes a reduction in the device's overall operating functionality to prevent overheating of heat generating components within the housing hosting these components.

BRIEF DESCRIPTION OF THE DRAWINGS

The description of the illustrative embodiments can be read in conjunction with the accompanying figures. It will be appreciated that for simplicity and clarity of illustration, elements illustrated in the FIGURES have not necessarily been drawn to scale. For example, the dimensions of some of the elements are exaggerated relative to other elements. Embodiments incorporating teachings of the present disclosure are shown and described with respect to the FIGURES presented herein, in which:

FIG. 4A depicts a side cross sectional view of the communication device of FIG. 2A with the housing assembly in an open position, according to one or more embodiments;

FIG. 4C depicts a side detail cross sectional view of an example thermal spreading assembly having one thermal spreader layer that is positioned proximate to a flexible circuit, according to one or more embodiments;

FIG. 4D depicts a side detail cross sectional view of an example thermal spreading assembly having one thermal spreader layer joined to a flexible circuit, according to one or more embodiments;

FIG. 4E depicts a side detail cross sectional view of an example thermal spreading assembly having two thermal spreader layers that are positioned proximate to and on opposite sides of a flexible circuit, according to one or more embodiments;

FIG. 4F depicts a side detail cross sectional view of an example thermal spreading assembly having two thermal spreader layers that are joined to opposite sides of a flexible circuit, according to one or more embodiments;

FIG. 4G depicts a side detail cross sectional view of an example thermal spreading assembly having two thermal spreader layers that are joined, according to one or more embodiments;

DETAILED DESCRIPTION

Figure 1:
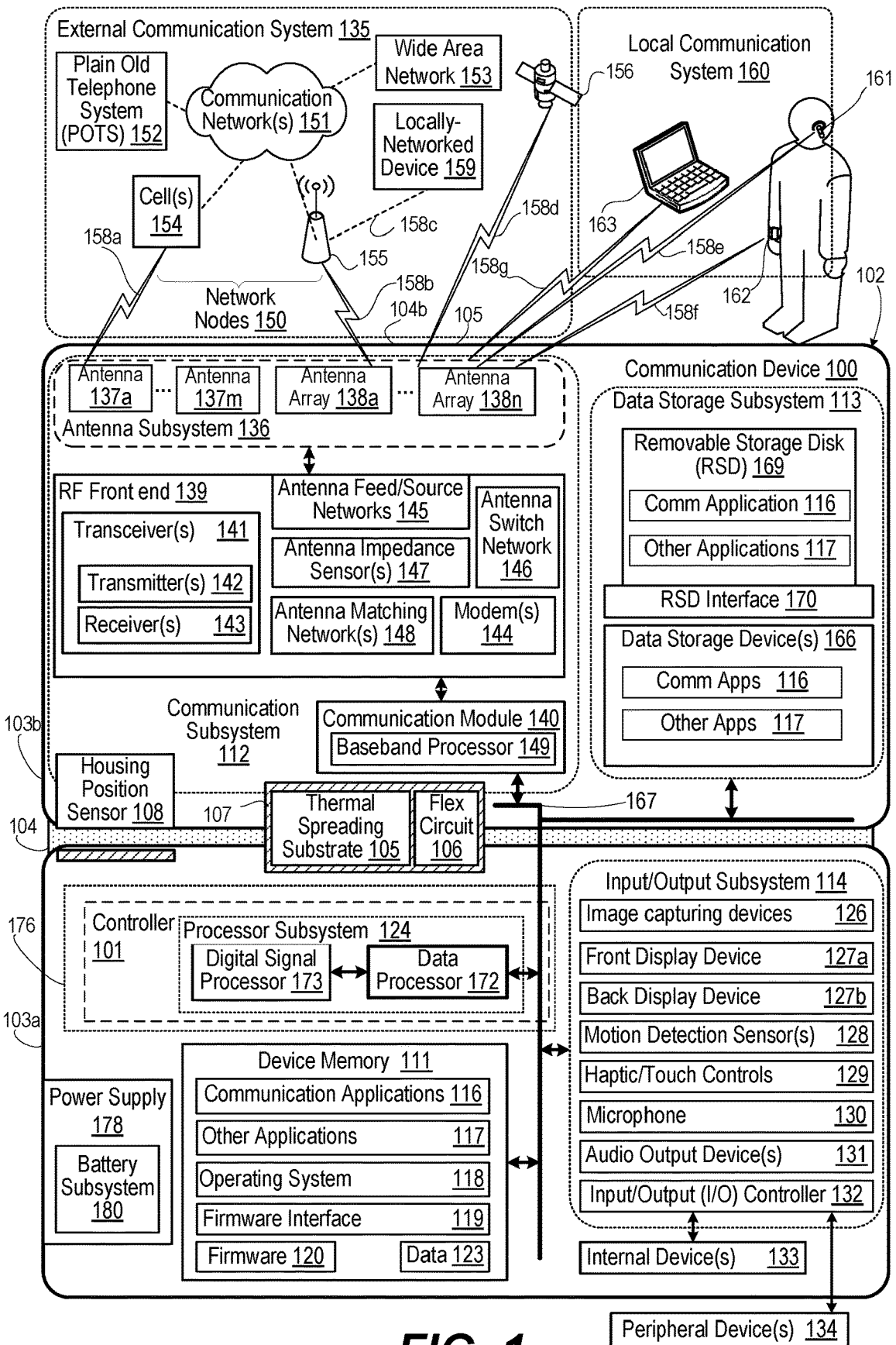
FIG. 1 depicts a functional block diagram of a communication environment of a communication device that incorporates thermal spreading within a configurable housing assembly, and within which the features of the present disclosure are advantageously implemented, according to one or more embodiments.

An electronic device has a configurable housing assembly with first and second device housings coupled together via a hinge. According to aspects of the present disclosure, the electronic device and a method provide enhanced thermal energy spreading within the electronic device via thermal spreader layer(s) of a flexible layer assembly extending through a hinge coupling the first and second device housings. The thermal spreader layer(s) become part of a thermal gradient between the first and the second device housings. A temperature gradient is the gradual variance in temperature with distance. The slope of the gradient is consistent within a material. A gradient is established anytime two materials at different temperatures are in physical contact with each other. The thermal spreader layer(s) reduce localized "hot spots" within the electronic device. The first device housing houses a first structure that generates thermal energy, such as a circuit board assembly. In one or more embodiments, a battery that is transferring a sustained level of current during charging or discharging can generate thermal energy. The first structure has at least one thermally conductive surface. The first device housing also has a first chamber. The second device housing has a second structure that is thermally conductive and can dissipate thermal energy. In one or more embodiments, the second structure is thermally coupled to a battery in the second device housing. The relatively large mass of the battery can act as a heat sink to absorb a transient heat load until the heat is dissipated to the outside of the device. The second device housing also has a second chamber. The hinge couples the first device housing to the second device housing such that the first device housing is pivotable about the hinge relative to the second device housing. The thermal spreader layer(s) has one end thermally coupled to the first structure within the first device housing and another end thermally coupled to the second structure within the second device housing. The thermal spreader layer(s) transfers thermal energy between the first and the second structures. The flexible layer assembly deforms to a deformed state within one or both of the first chamber and the second chamber when the first device housing and the second device housing pivot about the hinge from a closed position to an axially displaced open position. In one or more embodiments, the flexible layer assembly includes a flexible circuit having a first end thermally coupled at a first location within the first device housing and a second end fixedly coupled at a second location within the second device housing. The thermal spreader layer(s) is positioned on a first surface of the flexible circuit.

In the following detailed description of exemplary embodiments of the disclosure, specific exemplary embodiments in which the various aspects of the disclosure may be practiced are described in sufficient detail to enable those skilled in the art to practice the invention, and it is to be understood that other embodiments may be utilized and that logical, architectural, programmatic, mechanical, electrical, and other changes may be made without departing from the spirit or scope of the present disclosure. The following detailed description is, therefore, not to be taken in a limiting sense, and the scope of the present disclosure is defined by the appended claims and equivalents thereof. Within the descriptions of the different views of the figures, similar elements are provided similar names and reference numerals as those of the previous figure(s). The specific numerals assigned to the elements are provided solely to aid in the description and are not meant to imply any limitations (structural or functional or otherwise) on the described embodiment. It will be appreciated that for simplicity and clarity of illustration, elements illustrated in the FIGURES have not necessarily been drawn to scale. For example, the dimensions of some of the elements are exaggerated relative to other elements.

It is understood that the use of specific component, device and/or parameter names, such as those of the executing utility, logic, and/or firmware described herein, are for example only and not meant to imply any limitations on the described embodiments. The embodiments may thus be described with different nomenclature and/or terminology utilized to describe the components, devices, parameters, methods and/or functions herein, without limitation. References to any specific protocol or proprietary name in describing one or more elements, features or concepts of the embodiments are provided solely as examples of one implementation, and such references do not limit the extension of the claimed embodiments to embodiments in which different element, feature, protocol, or concept names are utilized. Thus, each term utilized herein is to be given its broadest interpretation given the context in which that term is utilized.

As further described below, implementation of the functional features of the disclosure described herein is provided within processing devices and/or structures and can involve use of a combination of hardware, firmware, as well as several software-level constructs (e.g., program code and/or program instructions and/or pseudo-code) that execute to provide a specific utility for the device or a specific functional logic. The presented FIGURES illustrate both hardware components and software and/or logic components.

Those of ordinary skill in the art will appreciate that the hardware components and basic configurations depicted in the FIGURES may vary. The illustrative components are not intended to be exhaustive, but rather are representative to highlight essential components that are utilized to implement aspects of the described embodiments. For example, other devices/components may be used in addition to or in place of the hardware and/or firmware depicted. The depicted example is not meant to imply architectural or other limitations with respect to the presently described embodiments and/or the general invention. The description of the illustrative embodiments can be read in conjunction with the accompanying figures. Embodiments incorporating teachings of the present disclosure are shown and described with respect to the FIGURES presented herein.

FIG. 1 is a functional block diagram of an electronic device, and more particularly communication device 100, which is managed by controller 101, in an operating environment and within which the features of the present disclosure are advantageously implemented. Configurable housing assembly 102 of communication device 100 has first and second device housings 103a-103b that are coupled via hinge 104. Hinge 104 has to satisfy a number of design objectives, such as being electrically non-conductive so that electrical ground currents are controlled. Antenna performance is affected by ground current paths. Hinge 104 can require use of materials selected for flexibility and structural strength that are necessarily thermally conductive. These design choices for hinges 104 of configurable housing assemblies 102 can prevent heat transfer between first and second device housings 103a-103b. Limiting thermal spreading within configurable housing assembly 102 limits operational use of communication 100 device. Thermal spreader layer(s) 105 extends through hinge 104 and has each end thermally coupled respectively to first and second device housings 103a-103b to enhance thermal spreading and dissipation. In one or more embodiments, thermal spreader layer(s) 105 are assembled to (i.e., affixed to or extended over) at least one face of flexible circuit 106 to form thermal spreading assembly 107. Flexible circuit 106 facilitates communicative coupling between components located respectively in first and second device housings 103a-103b.

Communication device 100 can be one of a host of different types of devices, including but not limited to, a mobile cellular phone, satellite phone, or smart-phone, a laptop, a net-book, an ultra-book, a networked smart watch or networked sports/exercise watch, and/or a tablet computing device or similar device that can include wireless and/or wired communication functionality. As an electronic device supporting wireless communication, communication device 100 can be utilized as, and also be referred to as, a system, device, subscriber unit, subscriber station, mobile station (MS), mobile, mobile device, remote station, remote terminal, user terminal, terminal, user agent, user device, a Session Initiation Protocol (SIP) phone, a wireless local loop (WLL) station, a personal digital assistant (PDA), computer workstation, a handheld device having wireless connection capability, a computing device, or other processing devices connected to a wireless modem. Communication device 100 includes housing assembly 102 that has a configurable "flip" form factor. Within the description of the remaining figures, references to similar components presented in a previous figure are provided the same reference numbers across the different figures. Where the named component is presented with different features or functionality, a different reference numeral or a subscripted reference numeral is provided (e.g., 100a in place of 100).

Referring to the specific component makeup and the associated functionality of communication device 100 of FIG. 1. Controller 101 is communicatively coupled to housing position sensor 108 that detects when housing assembly 102 is in: (i) a closed position; and (ii) at least a partially open position or a fully open position. Controller 101 configures communication subsystem 112 based at least in part on the position of housing assembly 102. Housing position sensor 108 can be one of: (i) a two binary position switch which detects the closed position and any other position, considered an at least partially open position (i.e., not a closed position); (ii) a multiple position switch of discrete values; or (iii) a continuous range sensor. The at least partially open position of housing assembly 102 can be one or more positions between 1° and a highest degree of relative rotation of the two housing portions around the hinge (e.g., 180°) defined as pivot angles between first and second device housings 103a-103b.

In one or more embodiments, communication device 100 includes device memory 111, communication subsystem 112, data storage subsystem 113, and input/output (I/O) subsystem 114. Device memory 111 and each subsystem (112, 113, and 114) are managed by controller 101. Device memory 111 includes program code and applications such as communication applications 116, and other application(s) 117 that use communication services. Device memory 111 further includes operating system (OS) 118, firmware interface 119, such as basic input/output system (BIOS) or Uniform Extensible Firmware Interface (UEFI), and firmware 120. Device memory 111 includes computer data 123 used by communication applications 116 and other applications 117.

Processor subsystem 124 of controller 101 executes program code to provide operating functionality of communication device 100. The software and/or firmware modules have varying functionality when their corresponding program code is executed by processor subsystem 124 or secondary processing devices within communication device 100. Processor subsystem 124 of controller 101 can execute program code of communication applications 116 and other applications 117 to configure communication device 100.

I/O subsystem 114 includes image capturing device(s) 126. I/O subsystem 114 includes user interface devices such as front and back flexible display devices 127a-127b, motion detection sensors 128, touch/haptic controls 129, microphone 130, and audio output device(s) 131. I/O subsystem 114 also includes I/O controller 132. In one or more embodiments, motion detection sensors 128 can detect an orientation and movement of the communication device 100 that indicates that the communication device 100 should activate front flexible display device 127a or should vertically reorient visual content presented on front and back flexible display devices 127a-127b. In one or more embodiments, motion detection sensors 128 are used for functions other than user inputs, such as detecting an impending ground impact. I/O controller 132 connects to internal devices 133, which are internal to housing assembly 102, and to peripheral devices 134, such as external speakers, which are external to housing assembly 102 of communication device 100. Examples of internal devices 133 are computing, storage, communication, or sensing components depicted within housing assembly 102. I/O controller 132 supports the necessary configuration of connectors, electrical power, communication protocols, and data buffering to act as an interface to internal devices 133 and peripheral devices 134 to other components of communication device 100 that use a different configuration for inputs and outputs.

Communication subsystem 112 of communication device 100 enables wireless communication with external communication system 135. Communication subsystem 112 includes antenna subsystem 136 having lower band antennas 137a-137m and higher band antenna array 138a-138n that can be attached in/at different portions of housing assembly 102. Communication subsystem 112 includes radio frequency (RF) front end 139 and communication module 140. RF front end 139 includes transceiver(s) 141, which includes transmitter(s) 142 and receiver(s) 143. RF front end 139 further includes modem(s) 144. RF front end 139 includes antenna feed/source networks 145, antenna switch network 146, antenna impedance sensor(s) 147, and antenna matching network(s) 148. Communication module 140 of communication subsystem 112 includes baseband processor 149 that communicates with controller 101 and RF front end 139. Baseband processor 149 operates in a baseband frequency range to encode data for transmission and decode received data, according to a communication protocol. Modem(s) 144 modulate baseband encoded data from communication module 140 onto a carrier signal to provide a transmit signal that is amplified by transmitter(s) 142. Modem(s) 144 demodulates each signal received from external communication system 135 detected by antenna subsystem 136. The received signal is amplified and filtered by receiver(s) 143, which demodulate received encoded data from a received carrier signal. Antenna feed/source networks 145 transmits or receives from particular portions of antenna subsystem 136 and can adjust a phase between particular portions of antenna subsystem 136. Antenna switch network 146 can connect particular combinations of antennas (137a-137m, 138a-138n) to transceiver(s) 141. Controller 101 can monitor changes in antenna impedance detected by antenna impedance sensor(s) 147 for determining portions of antenna subsystem 136 that are blocked. Antenna matching network(s) 148 are connected to particular lower band antennas 137a-137m to tune impedance respectively of lower band antennas 137a-137m to match impedance of transceivers 141. Antenna matching network(s) 148 can also be used to detune the impedance of lower band antennas 137a-137m to not match the impedance of transceivers 141 to electromagnetically isolate a particular antenna.

In one or more embodiments, controller 101, via communication subsystem 112, performs multiple types of over-the-air (OTA) communication with network nodes 150 of external communication system 135. Particular network nodes 150 can be part of communication networks 151 of public land mobile networks (PLMNs) that provide connections to plain old telephone systems (POTS) 152 for voice calls and wide area networks (WANs) 153 for data sessions. WANs 153 can include Internet and other data networks. The particular network nodes 150 can be cells 154 such as provided by base stations or base nodes that support cellular OTA communication using RAT as part of a radio access network (RAN). Unlike earlier generations of cellular services, where voice and data were handled using different RATs, both are now integrated with voice being considered one kind of data communication. Conventionally, broadband, packet-based transmission of text, digitized voice, video, and multimedia communication are provided using Fourth generation (4G) RAT of evolved UTMS radio access (E-UTRA), referred to a Long Term Evolved (LTE), although some cellular data service is still being provided by third generation (3G) Universal Mobile Telecommunications Service (UMTS). A fifth generation (5G) RAT, referred to as fifth generation new radio (5G NR), is being deployed to at least augment capabilities of 4G LTE with a yet higher capability of data transfer. Development continues for what will be six generation (6G) RATs and more advanced RATs. With wireless frequency spectrum seemingly ever expanding, additional antennas 137a-137m are incorporated to support newer radio access technologies (RATs) and multi band operation. Dual low band (2L) or quad low band (4L) multiple input multiple output (MIMO) operation dictates multiple antennas communicate on multiple bands simultaneously.

In one or more embodiments, network nodes 150 can be access node(s) 155 that support wireless OTA communication. Communication subsystem 112 can receive OTA communication from location services such as provided by global positioning system (GPS) satellites 156. Communication subsystem 112 communicates via OTA communication channel(s) 158a with cells 154. Communication subsystem 112 communicates via wireless communication channel(s) 158b with access node 155. In one or more particular embodiments, access node 155 supports communication using one or more IEEE 802.11 wireless local area network (WLAN) protocols. Wi-Fi is a family of wireless network protocols, based on the IEEE 802.11 family of standards, which are commonly used between user devices and network devices that provide Internet access. In one or more particular embodiments, communication subsystem 112 communicates with one or more locally networked devices 159 via wired or wireless link 158c provided by access node 155. Communication subsystem 112 receives downlink broadcast channel(s) 158d from GPS satellites 156 to obtain geospatial location information.

In one or more embodiments, controller 101, via communication subsystem 112, performs multiple types of OTA communication with local communication system 160. In one or more embodiments, local communication system 160 includes wireless headset 161 and smart watch 162 that are coupled to communication device 100 to form a personal access network (PAN). Communication subsystem 112 communicates via low power wireless communication channel(s) 158e with headset 161. Communication subsystem 112 communicates via second low power wireless communication channel(s) 158f, such as Bluetooth, with smart watch 162. In one or more particular embodiments, communication subsystem 112 communicates with other communication device(s) 163 via wireless link 158g to form an ad hoc network.

Data storage subsystem 113 of communication device 100 includes data storage device(s) 166. Controller 101 is communicatively connected, via system interlink 167, to data storage device(s) 166. Data storage subsystem 113 provides applications, program code, and stored data on nonvolatile storage that is accessible by controller 101. For example, data storage subsystem 113 can provide a selection of program code and applications such as communication applications 116 and other application(s) 117 that use communication services. These applications can be loaded into device memory 111 for execution by controller 101. In one or more embodiments, data storage device(s) 166 can include hard disk drives (HDDs), optical disk drives, and/or solid-state drives (SSDs), etc. Data storage subsystem 113 of communication device 100 can include removable storage device(s) (RSD(s)) 169, which is received in RSD interface 170. Controller 101 is communicatively connected to RSD 169, via system interlink 167 and RSD interface 170. In one or more embodiments, RSD 169 is a non-transitory computer program product or computer readable storage device. Controller 101 can access RSD 169 or data storage device(s) 166 to provision communication device 100 with program code, such as communication applications 116 and other applications 117. When executed by controller 101, the program code causes or configures communication device 100 to provide the multi-transceiver operational functionality using a configurable housing assembly 102 described herein.

Controller 101 includes processor subsystem 124, which includes one or more central processing units (CPUs), depicted as data processor 172. Processor subsystem 124 can include one or more digital signal processors 173 that are integrated with data processor 172 or are communicatively coupled to data processor 172, such as baseband processor 149 of communication module 140. In one or embodiments that are not depicted, controller 101 can further include distributed processing and control components that are peripheral or remote to housing assembly 102 or grouped with other components, such as I/O subsystem 114. Data processor 172 is communicatively coupled, via system interlink 167, to device memory 111. In one or more embodiments, controller 101 of communication device 100 is communicatively coupled via system interlink 167 to communication subsystem 112, data storage subsystem 113, and input/output subsystem 114. System interlink 167 represents internal components that facilitate internal communication by way of one or more shared or dedicated internal communication links, such as internal serial or parallel buses. As utilized herein, the term "communicatively coupled" means that information signals are transmissible through various interconnections, including wired and/or wireless links, between the components. The interconnections between the components can be direct interconnections that include conductive transmission media or may be indirect interconnections that include one or more intermediate electrical components. Although certain direct interconnections (interlink 167) are illustrated in FIG. 1, it is to be understood that more, fewer, or different interconnections may be present in other embodiments. Flex circuit 106 as part of interlink 167 electrically connects components in first device housing 103a to components in second device housing 103b to distribute power and/or transfer signals and/or data.

Controller 101 manages, and in some instances directly controls, the various functions and/or operations of communication device 100. These functions and/or operations include, but are not limited to including, application data processing, communication with other communication devices, navigation tasks, image processing, and signal processing. In one or more alternate embodiments, communication device 100 may use hardware component equivalents for application data processing and signal processing. For example, communication device 100 may use special purpose hardware, dedicated processors, general purpose computers, microprocessor-based computers, micro-controllers, optical computers, analog computers, dedicated processors and/or dedicated hard-wired logic.

Certain functional components of communication device 100 can generate localized thermal energy that needs to be spread and dissipated to ambient air to maintain components within an operational temperature range. In one or more embodiments, printed circuit board (PCB) assembly 176, which includes processor subsystem 124, and power supply 178, which includes battery subsystem 180, are positioned in first housing device 103a. Thermal energy from PCB assembly 176 and battery subsystem 180 can be transferred by thermal spreader layer(s) 105 to second housing device 103b. Thermally spreading the thermal energy to a larger housing assembly 102 ultimately increases radiant, conductive or convective cooling to the ambient environment.

Figures 2A, 2B:
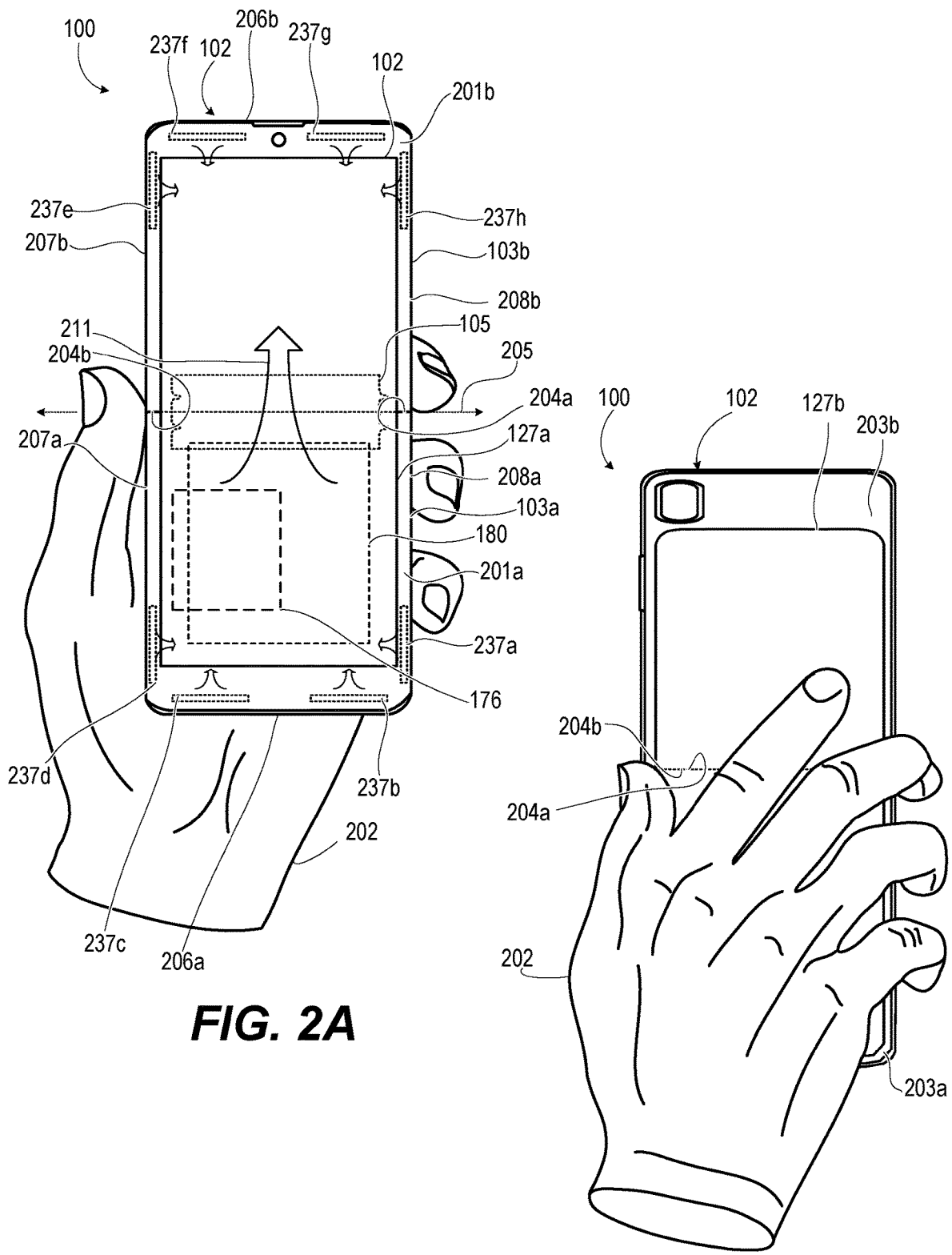
FIG. 2A depicts a front view of the communication device of FIG. 1 having a front flexible display and held in a hand of a user while the configurable housing assembly is in a fully open position, according to one or more embodiments.
FIG. 2B depicts a front view of the communication device of FIG. 1 having a back flexible display and held in a hand of a user while the configurable housing assembly is in a fully open position, according to one or more embodiments.

FIGS. 2A-2B present two views of communication device 100 with configurable housing assembly 102 in a fully open position and held in hand 202 of a user. FIG. 2A depicts a front view of communication device 100 having front flexible display device 127a on front surfaces 201a-201b. FIG. 2B depicts a back view of communication device 100 having back flexible display device 127b on back surfaces 203a-203b. With particular reference to FIG. 2A, housing assembly 102 is configurable by having first and second housing portions 103a-103b connected at respective first and second proximal sides 204a-204b to hinge 104, enabling relative movement between an open position and a closed position about lateral axis 205. Each of first and the second housing portions 103a-103b has respective distal side 206a-206b, opposite to proximal side 204a-204b. First (left) lateral side 207a and second (right) lateral side 208a extend between proximal side 204a and distal side 206a of first housing portion 103a. First lateral side 207b and second lateral side 208b extend between proximal side 204b and distal side 206b of second housing portion 103b. First device housing 103a contains battery subsystem 180 and PCB assembly 176 that can dissipate heat during device operation or battery charging/discharging and thus become warmer than other parts of housing assembly 102. Antennas 237a-237g can include lower band antennas 137a-137m and higher band antenna array 138a-138n (FIG. 1) and also generate thermal energy while transmitting. In one or more embodiments, antennas 237a-237g transmit and receive in one or more of ultra-low band (ULB), low band (LB), mid-band (MB), high band (HB), ultra-high band (UHB) and extremely high frequency (EHF) band. The latter is also referred to as millimeter wave (MM wave). Thermal spreader layer 105 transfers thermal energy 211 from first device housing 103a to second device housing 103b. Each of first and the second housing portions 103a-103b has thermally conductive components to further disperse the thermal energy 211 for convective and radiated cooling to the ambient air.

Figure 3A:
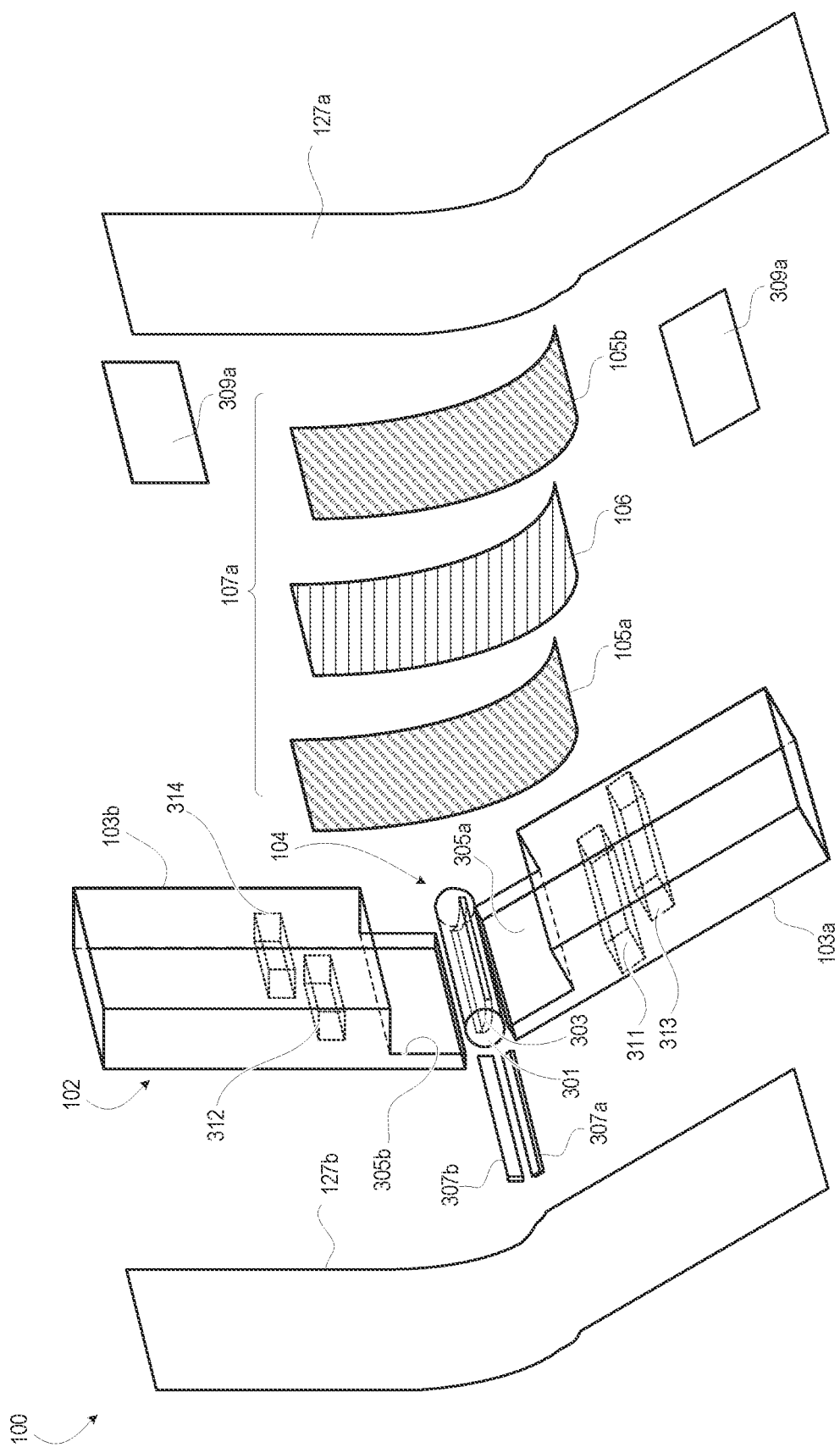
FIG. 3A depicts a three-dimensional disassembled view of the communication device of FIG. 2A having a configurable housing assembly in a partially open position, according to one or more embodiments.

FIG. 3A depicts a three-dimensional disassembled view of communication device 100 having configurable housing assembly 102 that is in a partially open position. Communication device 100 includes hinge 104 coupling first device housing 103a to second device housing 103b. In one or more embodiments, first device housing 103a is a base portion and second device housing 103b is a flip portion of communication device 100 that has a "flip" form factor. Hinge 104 has hinge body 301 through which channel 303 extends. First and second device housings 103a-103b respectively present first and second cavities 305a-305b adjacent to and on opposite sides of hinge body 301. Channel 303 provides a passage between present first and second cavities 305. In one or more embodiments, communication device 100 also includes front and back flexible display devices 127a-127b, purlins 307a-307b, first and second display supports 309a-309b, and thermal spreading assembly 107a having front and back thermal spreader layers 105a-105b on opposing surfaces of flexible circuit 106.

To illustrate components that can be affected by a structural discontinuity created by having configurable housing assembly 102, first structure 311, which is illustrated located within first device housing 103a, generates thermal energy. Second structure 312, located within second device housing 103b, does not generate thermal energy and can serve as a heat spreader or heat sink. In one or more embodiments, third structure 313 in first device housing 103a can be a source of electrical power. Fourth structure 314 in second device housing 103b can have a requirement for electrical power. In one or more embodiments, third structure 313, located within first device housing 103a, can have a requirement to communicate with fourth structure 314, which is located within second device housing 103b. Flexible circuit 106 can distribute the power and communication signals. Front and back thermal spreader layers 105a-105b can transfer the thermal energy.

Figure 3B:
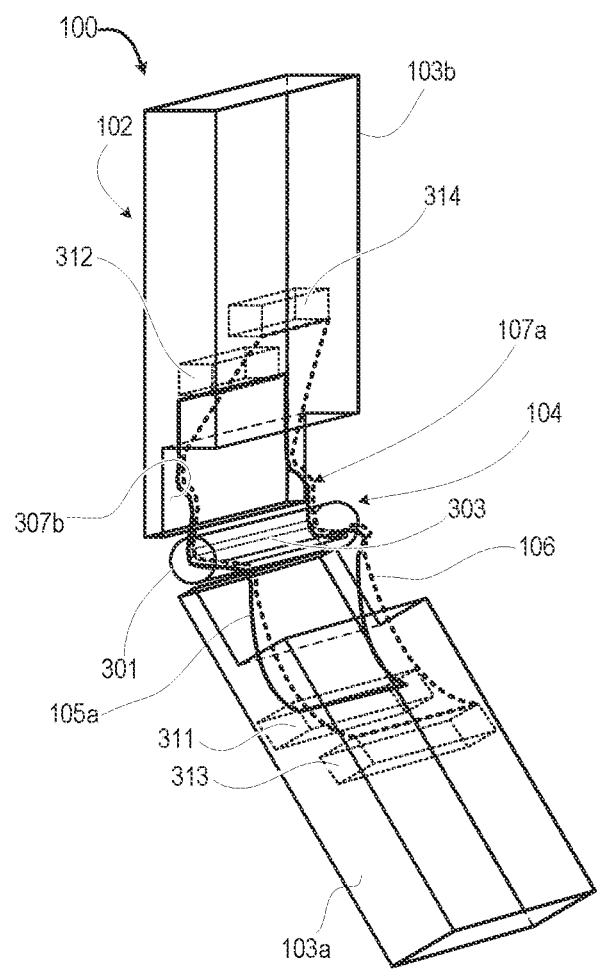
FIG. 3B depicts a three-dimensional partially assembled view of the communication device of FIG. 3B having a configurable housing assembly in a partially open position, according to one or more embodiments.

FIG. 3B depicts a three-dimensional partially assembled view of communication device 100 having configurable housing assembly 102 is a partially open position. Back thermal spreader layer 105a is thermally coupled at one end to first structure 311 positioned in first device housing 103a and is thermally coupled at another end to second structure 312 positioned in second device housing 103b. Flexible circuit 106 is fixedly/electrically coupled at one end to third structure 313, positioned within first device housing 103a, and is fixedly/electrically coupled at another end to fourth structure 314, which is located within second device housing 103b. Thermal spreading assembly 107a of both back thermal spreader layer 105 and flexible circuit 106 spans the distance from first and third structures 311, 313, extending through channel 303 in hinge body 301, to second and fourth structures 312, 314. First and second cavities 305a-305b enable excess length of thermal spreading assembly 107a to warp or deform.

Referring again to FIG. 3A, some functional components such as front and back flexible display devices 127a-127b can be coupled for thermal, power, and communication support from either first or second device housing 103a-103b. However, front and back flexible display devices 127a-127b have requirements for physical support throughout the range of positions of housing assembly 102. In one or more embodiments, communication device 100 includes only one of front and back flexible display devices 127a-127b. Front flexible display device 127a is positioned on and folded between first and second device housings 103a-103b while housing assembly 102 is in a closed position as described below regarding FIGS. 5-6. First and second display supports 309a-309b translate respectively in first and second cavities 305a-305b in between thermal spreading assembly 107a and front flexible display device 127a in relation to the position of housing assembly 102.

FIG. 4A depicts a side cross sectional view of communication device 100 while housing assembly 102 is in a fully open position. When housing assembly 102 is fully open, first and second display supports 309a-309b move forward in respective first and second cavities 305a-305b flush with adjacent front surfaces 201a-201b to position front flexible display device 127a in a flat orientation. Front surfaces 201a-201b respectively of first and second device housings 103a-103b rotate around hinge 104 to fully straighten front flexible display device 127a when housing assembly 102 is fully open. A respective volume of first and second cavities 305a-305b, behind first and second display supports 309a-309b, respectively, becomes available for thermal spreading assembly 107b to deform. Being The running distance for thermal spreading assembly 107b from each end through channel 303 is reduced to a minimum when housing assembly 102 is fully open. The reduced running distance creates a need to accommodate undulations in thermal spreading assembly 107b. Section 315 of first device housing 103a includes terminations of thermal spreading assembly 107b to receive thermal energy.

Figure 4B:
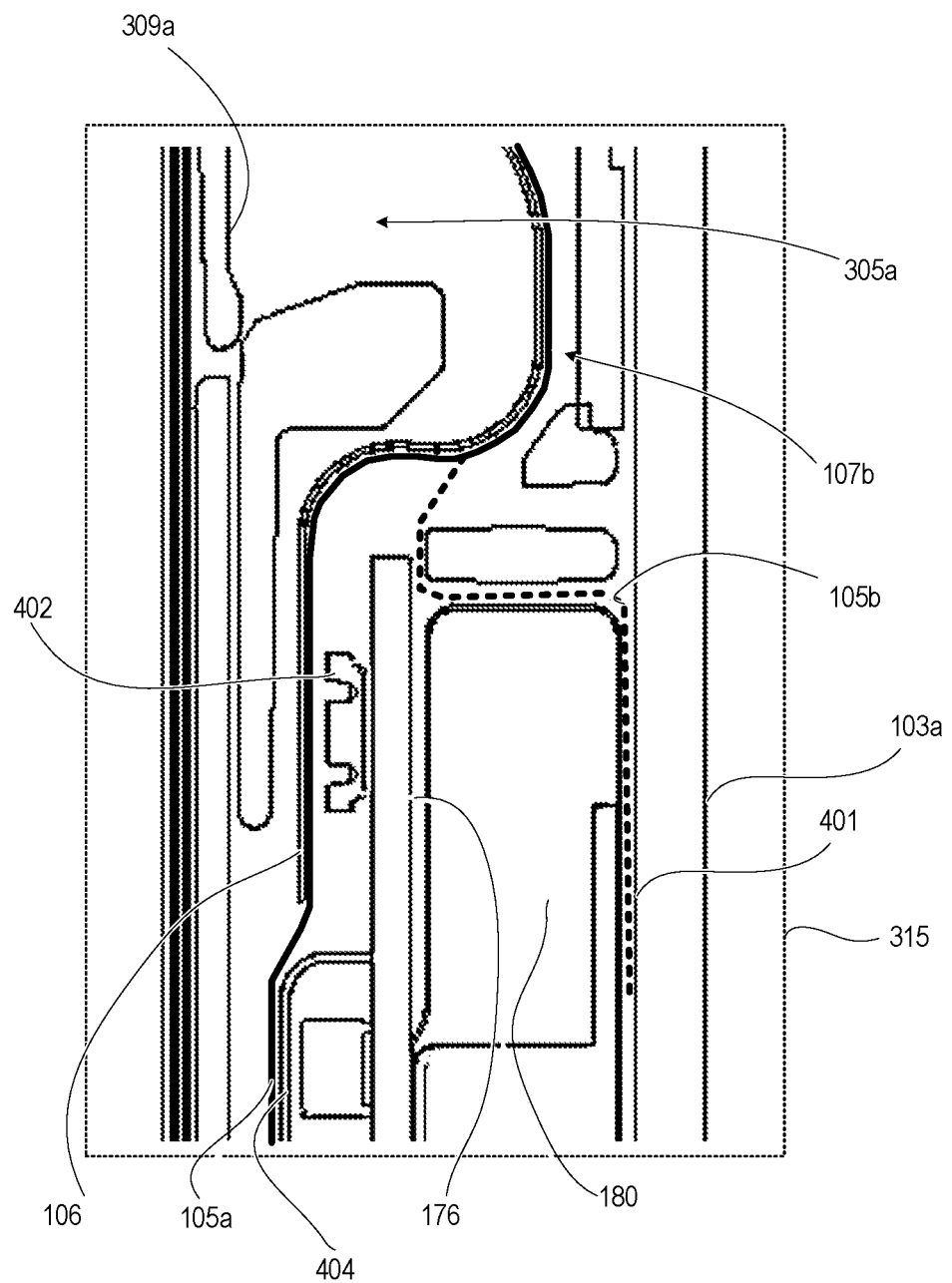
FIG. 4B depicts a side detail cross sectional view of the communication device of FIG. 4A with one end of the thermal spreader layer coupled to structures within one device housing, according to one or more embodiments.

FIG. 4B depicts a side detail cross sectional view of section 315 of communication device 100 of FIG. 4A with one end of thermal spreader layer 107b coupled within first device housing 103a. Thermal spreader layer 107b spans first cavity 307a with flexible circuit 106 fixedly and electrically coupled to PCB assembly 176. Thermal spreading layer 105a is thermally coupled to PCB assembly 176. Thermal spreader layer 105b is thermally coupled to battery subsystem 180 or thermally conductive cover 401 of first device housing 103a. In one or more embodiments, one of thermal spreader layers 105a-105b can be positioned between PCB assembly 176 and flexible circuit 106. An end portion of flexible circuit 106 or a male circuit connector shifts out of plane with thermal spreader layers 105a-105b to connect to female connector 402. Thermal spreader layer 105a continues to the top of PCB shield 405 of PCB assembly 176. Thermal spreader layer 105a can be directly thermally coupled to PCB assembly 176 or indirectly thermally coupled via a thermal pad or highly conductive "slug" or conductive housing. In one or more embodiments, flexible circuit 106 is routed separately from one or more thermal spreader layers 105a-105b. In an example, flexible circuit 106 does not pass through channel 303 such as by following a different passage from cavity 107b.

In one or more embodiments, variations of thermal spreading assembly 107 (FIG. 1) can be used for specific configurations of communication device 100 (FIG. 1). FIG. 4C depicts a side detail cross sectional view of example thermal spreading assembly 107c having one thermal spreader layer 105 that is positioned proximate to flexible circuit 106. FIG. 4D depicts a side detail cross sectional view of example thermal spreading assembly 107d having one thermal spreader layer 105 joined to flexible circuit 106, such as by using thermal or chemical bonding during fabrication, material adherence, or adhesive material. FIG. 4E depicts a side detail cross sectional view of example thermal spreading assembly 107e having two thermal spreader layers 105a-105b that are positioned proximate to and on opposite sides of flexible circuit 106. FIG. 4F depicts a side detail cross sectional view of an example thermal spreading assembly 107f having two thermal spreader layers 105a-105b that are joined to opposite sides of flexible circuit 106. FIG. 4G depicts a side detail cross sectional view of an example thermal spreading assembly 107g having two thermal spreader layers 105a-105b that are joined. For example, additional thermal carrying capacity and strength can be realized by combining two or more two thermal spreader layers 105a-105b.

Figure 5:
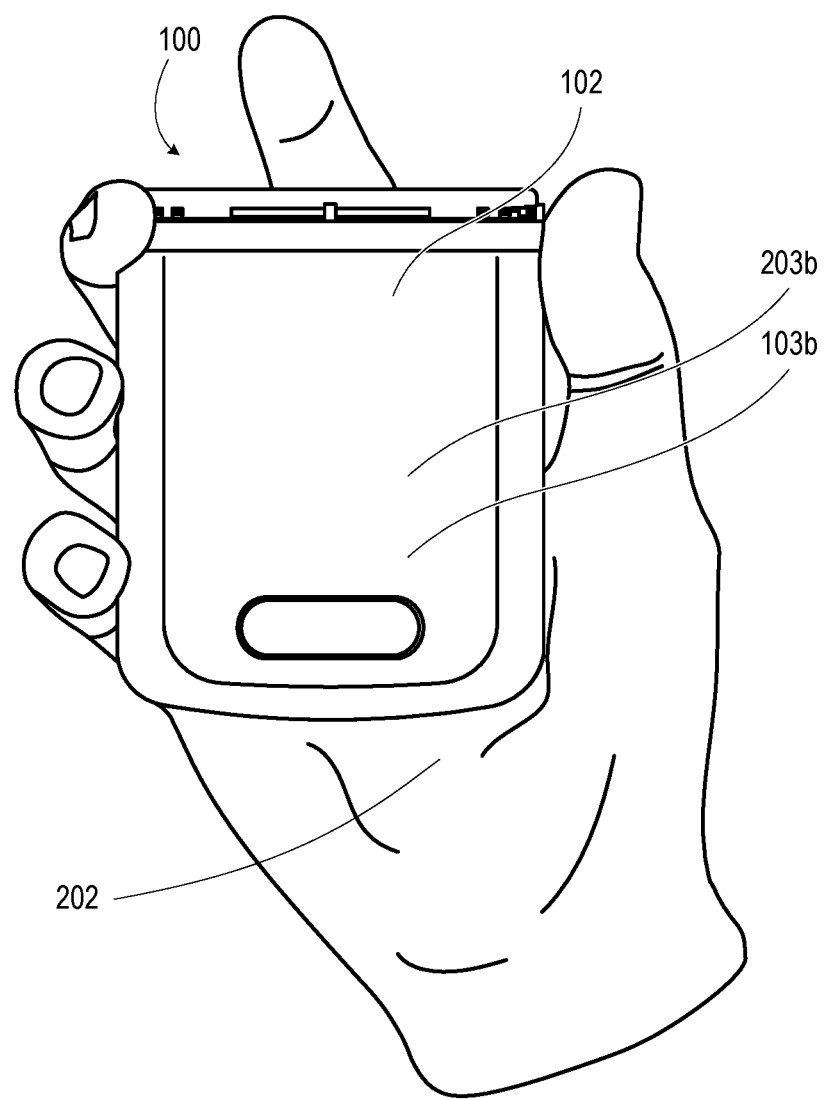
FIG. 5 depicts a front view of the communication device of FIG. 2A held in the hand of the user while the configurable housing assembly is in a fully closed position, according to one or more embodiments.
Figure 6:
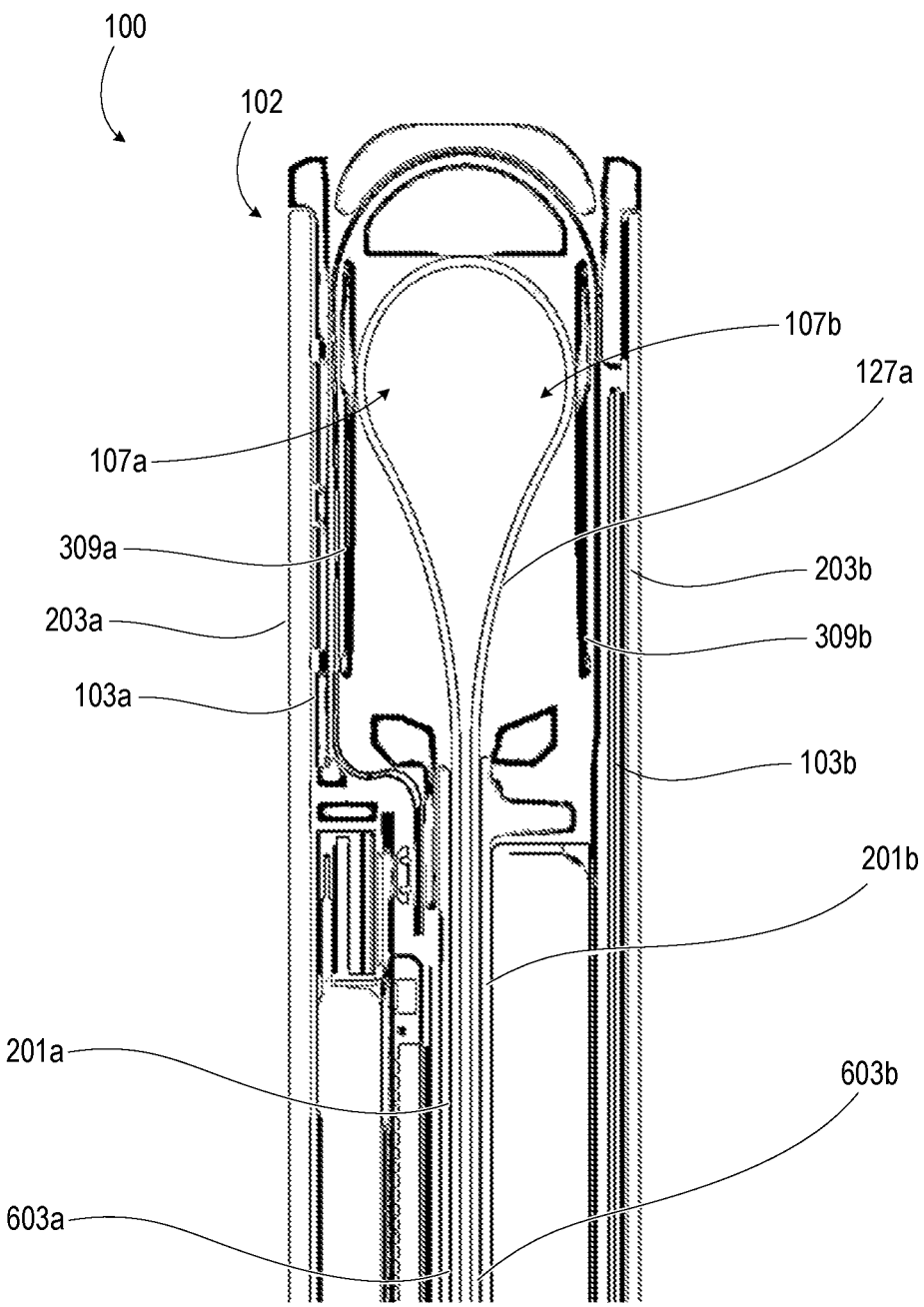
FIG. 6 depicts a side cross sectional view of the communication device of FIG. 5, according to one or more embodiments.

FIG. 5 depicts a front view of communication device 100 held in hand 202 of the user while configurable housing assembly 102 is in a fully closed position. Back surface 203b of second device housing 103b is positioned opposite to hand 202, which contacts back surface 203a (FIG. 2) of first device housing 103a (FIG. 1). FIG. 6 depicts a side cross sectional view of the communication device 100 while housing assembly 102 is in a closed position (FIG. 5). Front flexible display device 127a has first and second end portions 601a-601b that are positioned respectively on, and fixed to, front surfaces 201a-201b of first and second device housings 103a-103b. Central portion 603 of front flexible display device 127a deforms into a curved shape that is received by both cavities 107a-107b as respective first and second display supports 309a-309b move toward back surfaces 203a-203b.

Figure 7A:
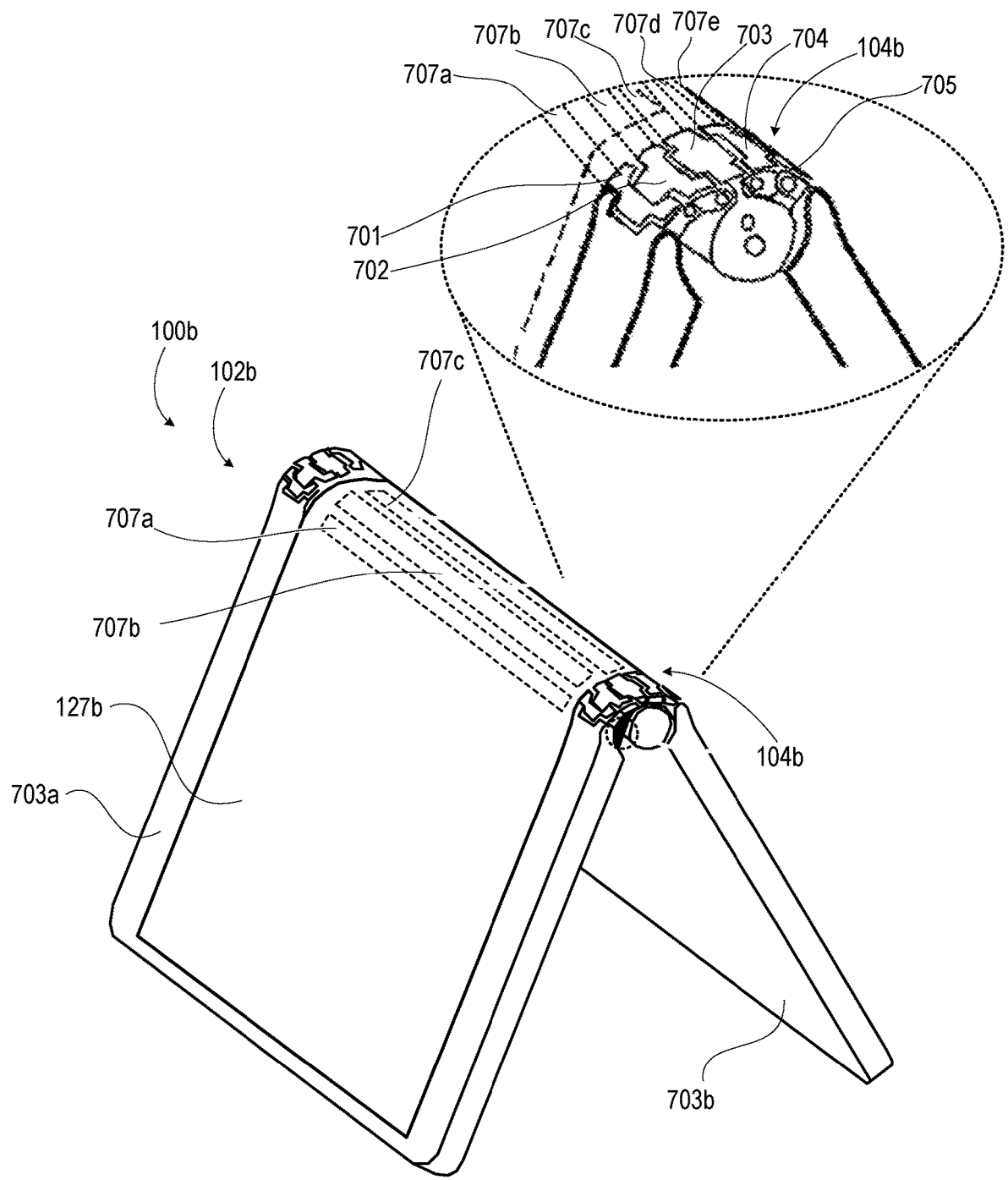
FIG. 7A depicts a three-dimensional back view of an example communication device that has a back flexible display and that is positioned with the configurable housing assembly in a partially open position, according to one or more embodiments.
Figure 7B:
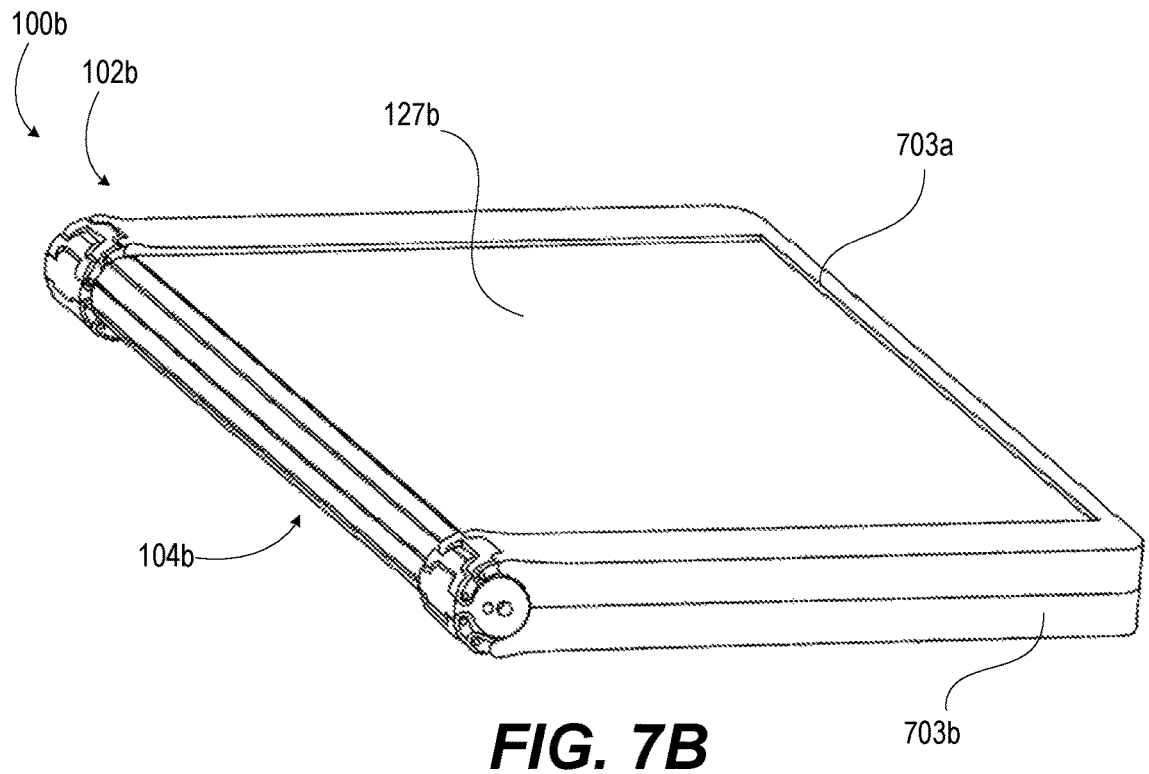
FIG. 7B depicts a three-dimensional view of the example communication device with the configurable housing assembly in a closed position, according to one or more embodiments.
Figure 7C:
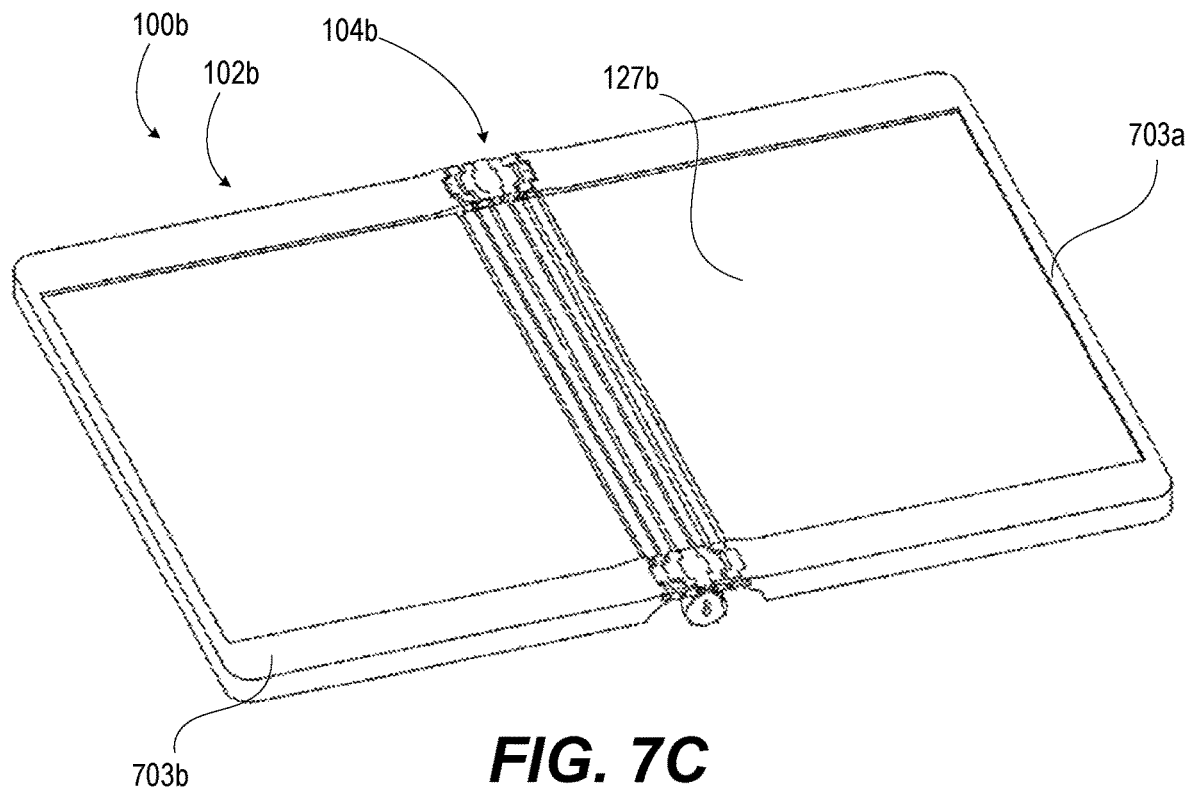
FIG. 7C depicts a three-dimensional front view of the example communication device with the configurable housing assembly in an open position, according to one or more embodiments.
Figure 7D:
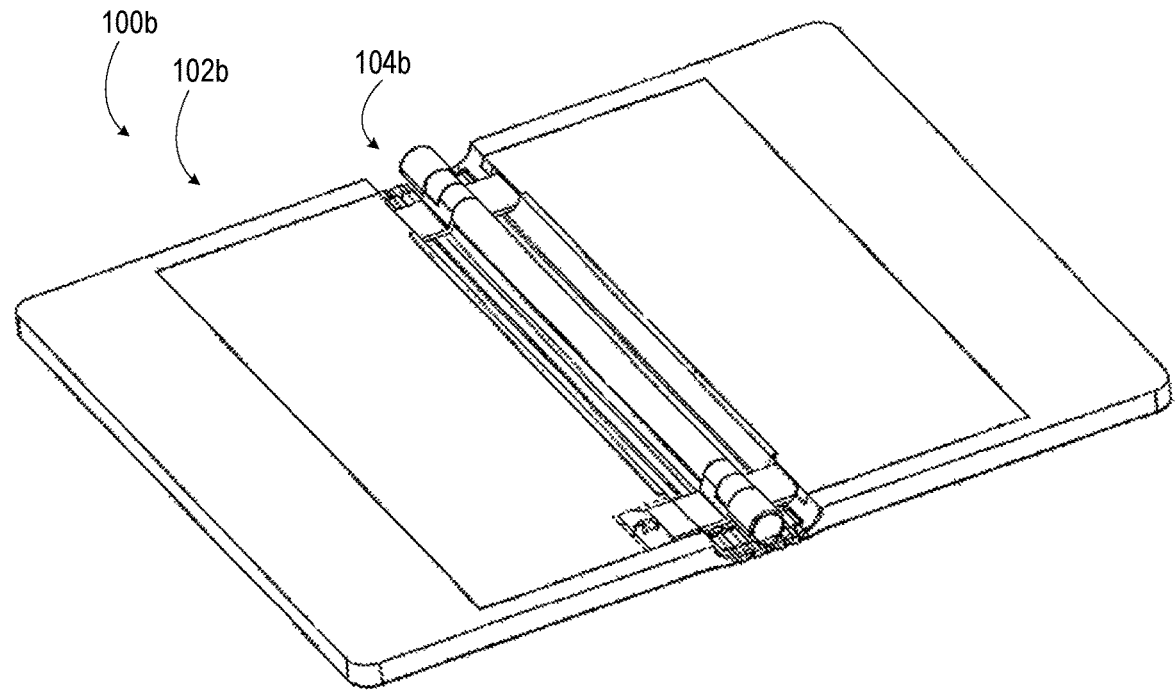
FIG. 7D depicts a three-dimensional back view of the example communication device of FIG. 7C with the configurable housing assembly in the open position, according to one or more embodiments.
Figure 7E:
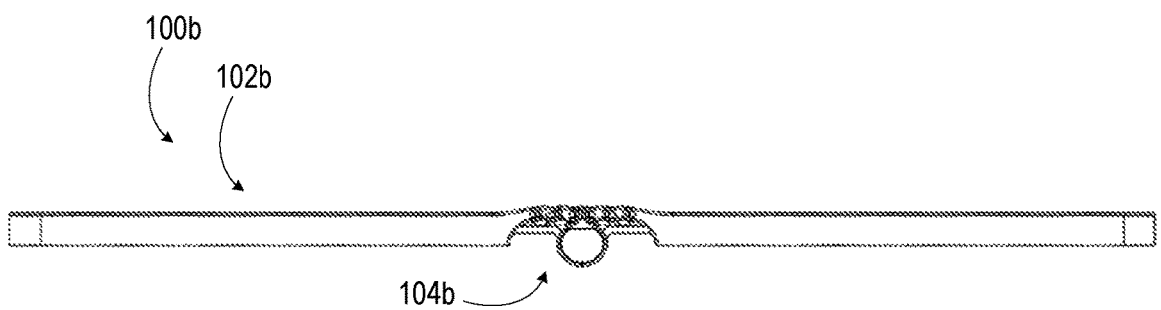
FIG. 7E depicts a side view of the example communication device of FIG. 7C with the configurable housing assembly in the open position, according to one or more embodiments.

FIG. 7A depicts a three-dimensional view of example communication device 100b that has back flexible display 127b and that is positioned with configurable housing assembly 102b in a partially open ("bent") position. FIG. 7B depicts a three-dimensional view of the example communication device 100b with configurable housing assembly 102b in a closed position. FIG. 7C depicts a three-dimensional back view of example communication device 100b with configurable housing assembly 102b in the open position. FIG. 7D depicts a three-dimensional front view of example communication device 100b with configurable housing assembly 100b in an open position. FIG. 7E depicts a side view of example communication device 100b with configurable housing assembly 102b in the open position.

With particular reference to FIG. 7A, communication device 100b has hinge 104b coupling first device housing 703a with a second device housing 703b in accordance with one or more embodiments of disclosure. Hinge 104b facilitates pivoting of first device housing 703a relative to second device housing 703b. Back flexible display 127b spans hinge 104b. On each lateral edge, hinge 104b includes one or more linkage members 701-705. Accordingly, hinge 104b defines a multi-link hinge between first device housing 703a and second device housing 703b. In other embodiments, hinge 104b can include fewer linkage members or more linkage members based upon application. In one or more embodiment, each respective pair of linkage members 701-705 on opposite lateral sides is stepped with respective rigid purlins 707a-707e therebetween to receive and protect back flexible display 127b. A major underside face of back flexible display 127b rests on purlins 707a-707e (FIG. 7C). Purlins 707a-707e (FIG. 7C) are positioned between back flexible display 127b and hinge 104a to mechanically support back flexible display 127b when first device housing 703a pivots about hinge 104a relative to second device housing 703b. Since the back flexible display 127b remains visible, geometries of hinge 104a and positioning of purlins 707c-707e (FIG. 7C) are selected to maintain back flexible display 127b in a taut condition (i.e., not undulating) against first and second device housings 703a-703b.

Figure 8A:
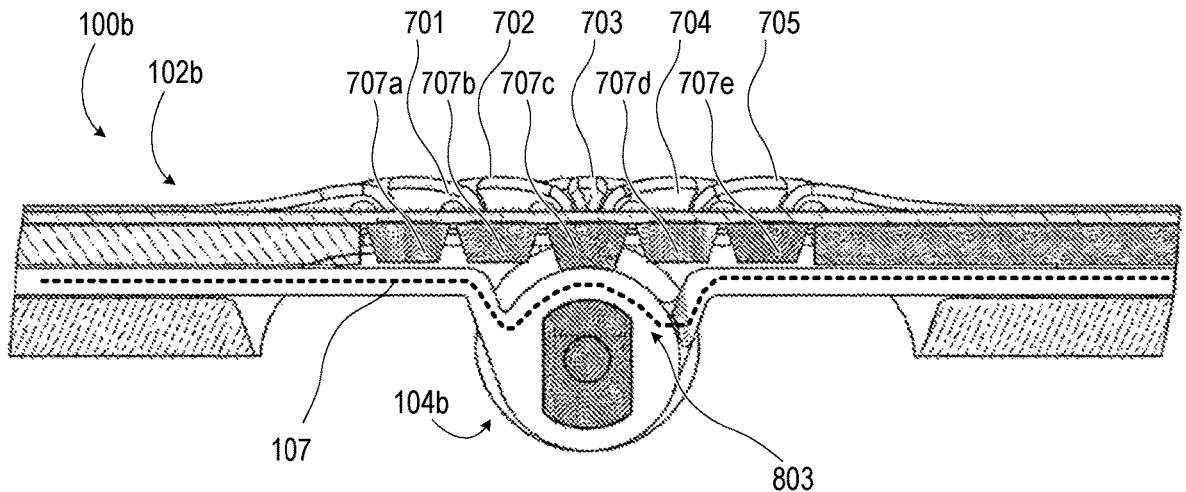
FIG. 8A depicts a side cross sectional view of a hinge portion of an example communication device having a back flexible display supported by a configurable housing assembly in an open position with a flexible spreading assembly routed through a channel in a hinge body, according to one or more embodiments.
Figure 8B:
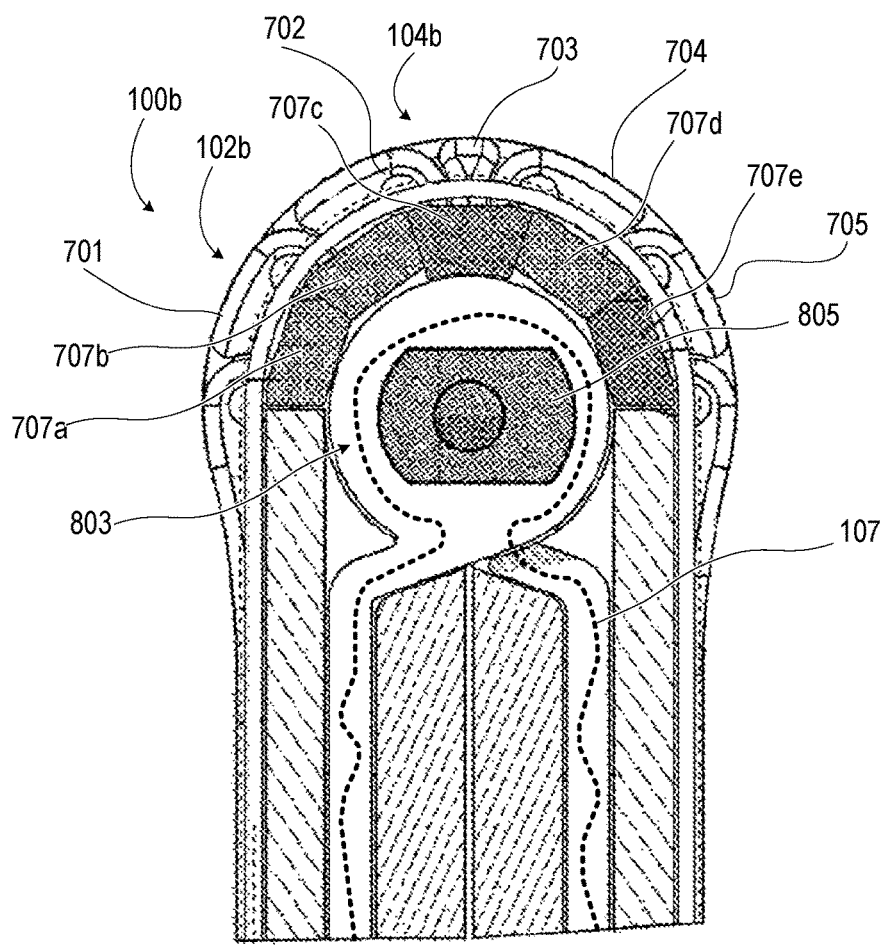
FIG. 8B depicts a side cross sectional view of the hinge portion of the communication device of FIG. 8A while the configurable housing assembly is in a closed position, according to one or more embodiments.

FIG. 8A depicts a side cross sectional view of hinge 104b of example communication device 100b having back flexible display 127b supported by configurable housing assembly 102b in an open position. Flexible spreading assembly 107 is routed through channel 803 in hinge body 805. FIG. 8B depicts a side detail cross sectional view of hinge 104b of communication device 100b while configurable housing assembly 102c is in a closed position.

Figure 9A:
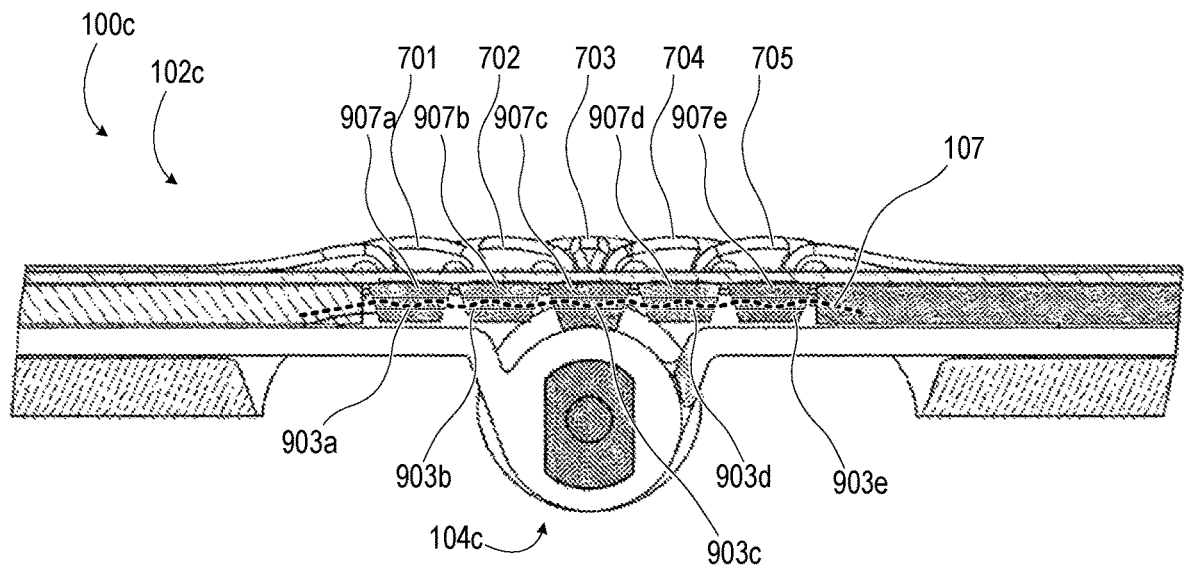
FIG. 9A depicts a side cross sectional view of a hinge portion of an example communication device having a back flexible display supported by a configurable housing assembly in an open position with a flexible spreading assembly routed through channels in a purlin assembly, according to one or more embodiments.
Figure 9B:
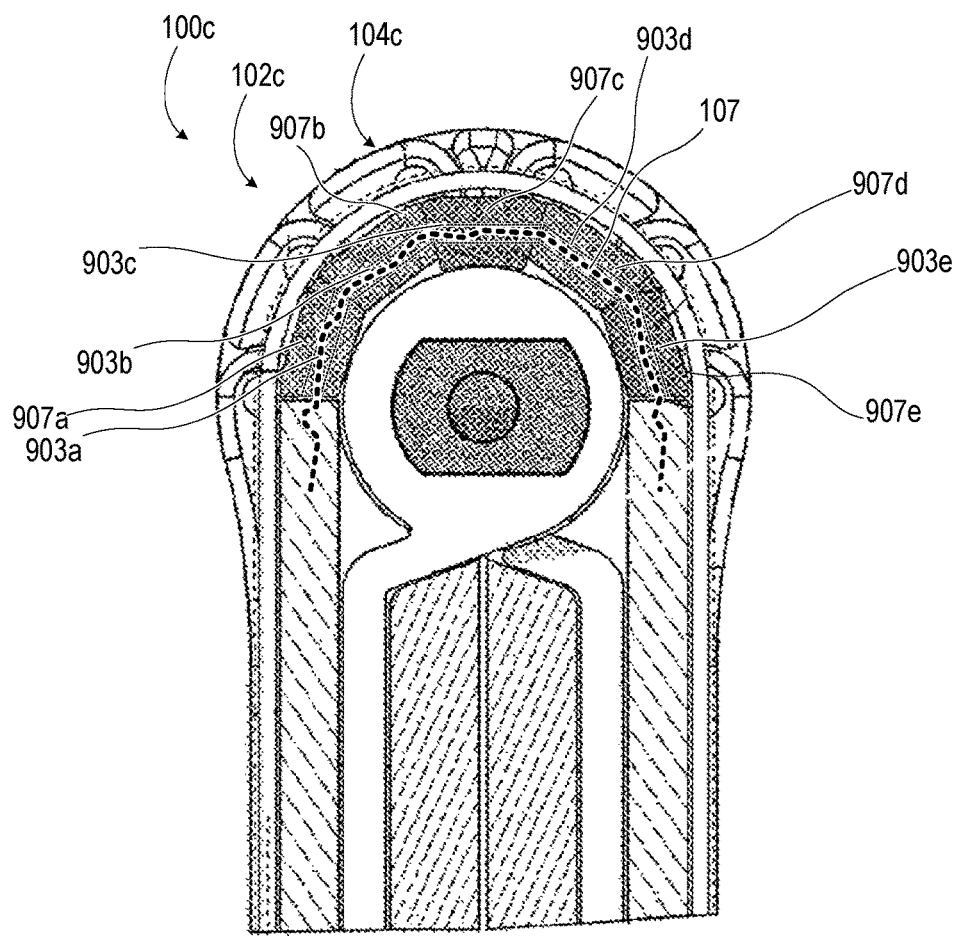
FIG. 9B depicts a side cross sectional view of the hinge portion of the communication device of FIG. 9A while the configurable housing assembly is in a closed position, according to one or more embodiments.

FIG. 9A depicts a side detail cross sectional view of hinge 104c of example communication device 100c having back flexible display 127b supported by configurable housing assembly 102c in an open position. Flexible spreading assembly 107 is routed through channels 903a-903e respectively in purlins 907a-907e. FIG. 9B depicts a side cross sectional view of hinge 104c of communication device 100c while configurable housing assembly 102c is in a closed position.

Figure 10:
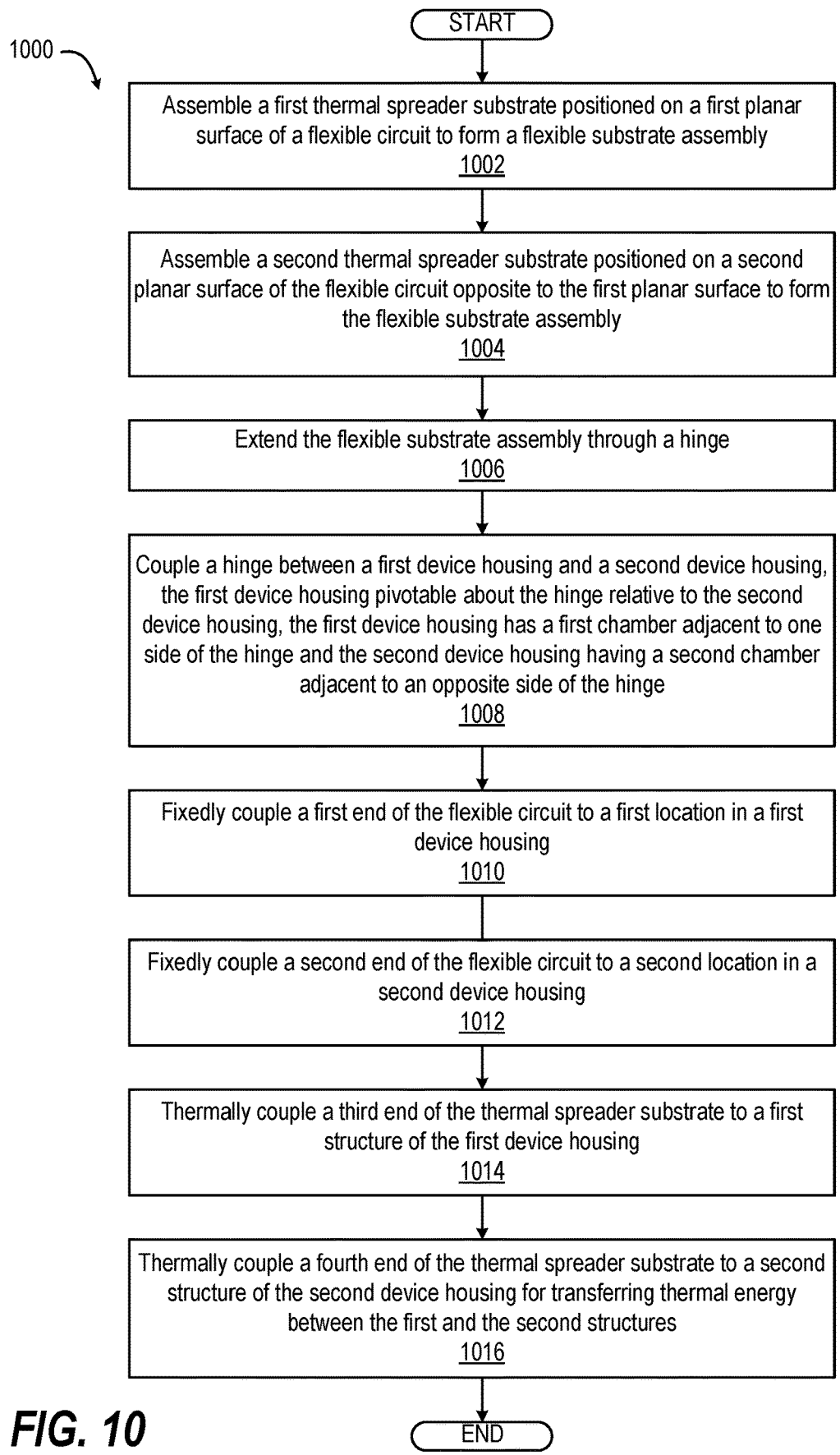
FIG. 10 presents a flow diagram of a method for assembling an electronic device that incorporates thermal spreader layer(s) within a configurable housing, according to one or more embodiments.

FIG. 10 presents a flow diagram of method 1000 for assembling an electronic device such as communication device 100 (FIG. 1), 100a (FIG. 7), 100b (FIG. 8A), or 100c (FIG. 9A) that incorporates thermal spreader layer(s) within a configurable housing assembly 102 (FIG. 1), 102a (FIG. 7), 102b (FIG. 8A), or 102c (FIG. 9A). The description of method 1000 is provided with general reference to the specific components illustrated within the preceding FIGS. 1-6, 7A-7E, 8A-8B, and 9A-9B. In at least one embodiment, an automated manufacturing system, managed by a controller having one or more microprocessors, performs method 1000 to assemble communication device 100 (FIG. 1), 100a (FIG. 7), 100b (FIG. 8A), or 100c (FIG. 9A). Specific components described in method 1000 can be identical or similar to components of the same name used to describe preceding FIGS. 1-6, 7A-7E, 8A-8B, and 9A-9B. Method 1000 includes assembling a first thermal spreader layer positioned on a first surface of a flexible circuit to form a flexible layer assembly 1002). In one or more embodiments, method 1000 includes assembling a second thermal spreader layer positioned on a second surface of the flexible circuit opposite to the first surface to form the flexible layer assembly (block 1004). Method 1000 includes extending the flexible layer assembly through a hinge (block 1006). Method 1000 includes coupling the hinge between a first device housing and a second device housing, the first device housing pivotable about the hinge relative to the second device housing (block 1008). The housing assembly has a first chamber adjacent to one side of the hinge and the second device housing has a second chamber adjacent to an opposite side of the hinge. Method 1000 includes fixedly coupling a first end of the flexible circuit to a first location/component in the first device housing (block 1010). Method 1000 includes fixedly coupling a second end of the flexible circuit to a second location/component in the second device housing (block 1012). Method 1000 includes thermally coupling a third end of the thermal spreader layer to a first structure of the first device housing (block 1014). Method 1000 includes thermally coupling a fourth end of the thermal spreader layer to a second structure of the second device housing for transferring thermal energy between the first and the second structures (block 1016). The flexible layer assembly deforms to a deformed state within one or both of the first chamber and the second chamber when the first device housing and the second device housing pivot about the hinge from a closed position to an axially displaced open position. Then method 1000 ends.

Aspects of the present innovation are described above with reference to flowchart illustrations and/or block diagrams of methods, apparatus (systems) and computer program products according to embodiments of the innovation. It will be understood that each block of the flowchart illustrations and/or block diagrams, and combinations of blocks in the flowchart illustrations and/or block diagrams, can be implemented by computer program instructions. These computer program instructions may be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

As will be appreciated by one skilled in the art, embodiments of the present innovation may be embodied as a system, device, and/or method. Accordingly, embodiments of the present innovation may take the form of an entirely hardware embodiment or an embodiment combining software and hardware embodiments that may all generally be referred to herein as a "circuit," "module" or "system."

While the innovation has been described with reference to exemplary embodiments, it will be understood by those skilled in the art that various changes may be made, and equivalents may be substituted for elements thereof without departing from the scope of the innovation. In addition, many modifications may be made to adapt a particular system, device, or component thereof to the teachings of the innovation without departing from the essential scope thereof. Therefore, it is intended that the innovation not be limited to the particular embodiments disclosed for carrying out this innovation, but that the innovation will include all embodiments falling within the scope of the appended claims. Moreover, the use of the terms first, second, etc. do not denote any order or importance, but rather the terms first, second, etc. are used to distinguish one element from another.

The terminology used herein is for the purpose of describing particular embodiments only and is not intended to be limiting of the innovation. As used herein, the singular forms "a", "an" and "the" are intended to include the plural forms as well, unless the context clearly indicates otherwise. It will be further understood that the terms "comprise" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present innovation has been presented for purposes of illustration and description but is not intended to be exhaustive or limited to the innovation in the form disclosed. Many modifications and variations will be apparent to those of ordinary skill in the art without departing from the scope and spirit of the innovation. The embodiments were chosen and described in order to best explain the principles of the innovation and the practical application, and to enable others of ordinary skill in the art to understand the innovation for various embodiments with various modifications as are suited to the particular use contemplated.

What is claimed is:

1. An electronic device, comprising:
a first device housing having a first structure that is thermally conductive and generates thermal energy, the first device housing having a first chamber;
a second device housing having a second chamber with a heat spreader or heat sink as a second structure that is thermally conductive;
a hinge coupling the first device housing to the second device housing, the first device housing pivotable about the hinge relative to the second device housing; and
a flexible layer assembly extending through the first chamber and the second chamber with one segment extending through the hinge, the flexible layer assembly comprising:
a flexible circuit having a first end thermally coupled at a first location within the first device housing and a second end thermally coupled at a second location within the second device housing, the first chamber situated between the first location and the hinge, the second chamber situated between the second location and the hinge; and
a first thermal spreader layer positioned on a first surface of the flexible circuit and having a third end thermally coupled to the first structure within the first device housing and a fourth end thermally coupled to the second structure within the second device housing, the first thermal spreader layer transferring thermal energy from the first structure that generates thermal energy to the second structure that is the heat spreader or heat sink;
wherein the first structure comprises a battery assembly and a circuit board assembly that generate the thermal energy, the flexible layer assembly comprising the first thermal spreader layer thermally coupled to the battery assembly, and a second thermal spreader layer thermally coupled to the circuit board assembly;
the flexible layer assembly deforming to a deformed state within one or both of the first chamber or the second chamber when the first device housing and the second device housing pivot about the hinge from a closed position to an axially displaced open position.

2. The electronic device of claim 1, wherein the thermal spreader layer comprises graphite to conduct the thermal energy.

3. The electronic device of claim 1, wherein at least a portion of the flexible circuit is joined to the first thermal spreader layer.

4. The electronic device of claim 1, wherein the flexible layer assembly comprises the second thermal spreader layer positioned on a second surface of the flexible circuit, opposite to the first thermal spreader layer, the second thermal spreader layer having a fifth end thermally coupled to the circuit board assembly within the first device housing and a sixth end thermally coupled to the second structure within the second device housing.

5. The electronic device of claim 1, wherein:
the hinge comprises:
a hinge body; and
a channel that opens on opposite ends to the first and the second chambers, the flexible layer assembly extending through the channel; and
the electronic device further comprises a flexible display coupled to a front face respectively of the first device housing and the second device housing and spanning an inward side of the hinge, the flexible display deforming into the first and the second chambers when the first device housing pivots about the hinge relative to the second device housing to a closed position.

6. The electronic device of claim 5, further comprising:
a first display support plate positioned to move in the first chamber between the flexible layer assembly and the flexible display; and
a second display support plate positioned to move in the second chamber between the flexible layer assembly and the flexible display, the first and the second display support plates moving in correspondence to a deformation of the flexible display.

7. An electronic device, comprising:
a first device housing having a first structure that is thermally conductive and generates thermal energy, the first device housing having a first chamber;
a second device housing having a second chamber with a heat spreader or heat sink as a second structure that is thermally conductive;
heat generating functional components supported by the first device housing;
a hinge coupling the first device housing to the second device housing, the first device housing pivotable about the hinge relative to the second device housing;
a flexible display positioned on at least a portion of each of the first and the second device housings and spanning the hinge; and
a flexible layer assembly extending through the first chamber and the second chamber with one segment of the flexible layer assembly extending through the hinge, the flexible layer assembly comprising a first thermal spreader layer having one end thermally coupled to the first structure within the first device housing and another end thermally coupled to the second structure within the second device housing, the first thermal spreader layer transferring thermal energy from the first device housing to the heat spreader or heat sink within the second device housing, wherein the first structure comprises a battery assembly and a circuit board assembly that generate the thermal energy, the first thermal spreader layer thermally coupled to the battery assembly, and the second thermal spreader layer thermally coupled to the circuit board assembly, the flexible layer assembly deforming to a deformed state within one or both of the first chamber or the second chamber when the first device housing and the second device housing pivot about the hinge from a closed position to an axially displaced open position.

8. The electronic device of claim 7, wherein the thermal spreader layer comprises graphite to conduct the thermal energy.

9. The electronic device of claim 8, wherein the flexible layer assembly comprises a flexible circuit having a first end fixedly coupled at a first location within the first device housing and a second end fixedly coupled at a second location within the second device housing, the first chamber situated between the first location and the hinge, the second chamber situated between the second location and the hinge.

10. The electronic device of claim 7, further comprising one or more antennas positioned at a peripheral position on one of the first and the second device housing, the one or more antennas generating thermal energy while transmitting, the thermal energy being transferred into the respective one of the first and the second device housing.

11. The electronic device of claim 10, wherein the flexible layer assembly comprises the second thermal spreader layer positioned on a second surface of the flexible circuit, opposite to the first thermal spreader layer, the second thermal spreader layer having a fifth end thermally coupled to the circuit board assembly within the first device housing and a sixth end thermally coupled to the second structure within the second device housing.

12. The electronic device of claim 7, wherein:
the hinge comprises:
　a hinge body; and
　a channel that opens on opposite ends to the first and the second chambers, the flexible layer assembly extending through the channel; and
the electronic device further comprising the flexible display coupled to a front face respectively of the first device housing and the second device housing and spanning an inward side of the hinge, flexible display to deform into the first and the second chambers when the first device housing pivots about the hinge relative to the second device housing to a closed position.

13. The electronic device of claim 7, further comprising:
a first display support plate positioned to move in the first chamber between the flexible layer assembly and the flexible display; and
a second display support plate positioned to move in the second chamber between the flexible layer assembly and the flexible display, the first and the second display support plates move in correspondence to the deformation of the flexible display.

14. A method, comprising:
assembling a first thermal spreader layer positioned on a first surface of a flexible circuit to form a flexible layer assembly;
extending the flexible layer assembly through a hinge;
coupling the hinge between a first device housing and a second device housing, the first device housing pivotable about the hinge relative to the second device housing, the first device housing has a first chamber adjacent to one side of the hinge and the second device housing having a second chamber adjacent to an opposite side of the hinge;
fixedly coupling a first end of the flexible circuit to a first location in a first device housing;
thermally coupling a third end of the thermal spreader layer to a first structure of the first device housing, the first structure being thermally conductive and generating thermal energy;
wherein the first structure comprises a battery assembly and a circuit board assembly that generate the thermal energy, and the method further comprises thermally coupling the first thermal spreader layer to the battery assembly, and thermally coupling a second thermal spreader layer to the circuit board assembly; and
thermally coupling a fourth end of the thermal spreader layer to a heat spreader or heat sink within the second chamber, the heat spreader or heat sink providing a second structure of the second device housing that is thermally conductive and used for transferring thermal energy from the first structure that generates thermal energy to the second structure that is the heat spreader or heat sink;
wherein the flexible layer assembly deforms to a deformed state within one or both of the first chamber or the second chamber when the first device housing and the second device housing pivot about the hinge from a closed position to an axially displaced open position.

15. The method of claim 14, further comprising: assembling the second thermal spreader layer positioned on a second surface of the flexible circuit opposite to the first surface to form the flexible layer assembly.

16. The method of claim 14, further comprising positioning one or more antennas at a peripheral position on one of the first and the second device housing, the one or more antennas generating thermal energy while transmitting, the thermal energy being transferred into the respective one of the first and the second device housing.

* * * * *